(12) United States Patent
Wang et al.

(10) Patent No.: US 11,749,725 B2
(45) Date of Patent: Sep. 5, 2023

(54) METHODS OF FORMING SOURCE/DRAIN CONTACTS IN FIELD-EFFECT TRANSISTORS

(71) Applicant: Taiwan Semiconductor Manufacturing Co., Ltd., Hsin-Chu (TW)

(72) Inventors: Sheng-Tsung Wang, Hsinchu (TW); Chia-Hao Chang, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 29 days.

(21) Appl. No.: 17/099,304

(22) Filed: Nov. 16, 2020

(65) Prior Publication Data

US 2021/0074819 A1 Mar. 11, 2021

Related U.S. Application Data

(62) Division of application No. 16/386,853, filed on Apr. 17, 2019, now Pat. No. 10,840,342.

(60) Provisional application No. 62/718,783, filed on Aug. 14, 2018.

(51) Int. Cl.
*H01L 29/40* (2006.01)
*H01L 21/3105* (2006.01)
*H01L 21/311* (2006.01)
*H01L 29/45* (2006.01)

(52) U.S. Cl.
CPC ...... *H01L 29/401* (2013.01); *H01L 21/31053* (2013.01); *H01L 21/31111* (2013.01); *H01L 29/45* (2013.01)

(58) Field of Classification Search
CPC combination set(s) only.
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |

(Continued)

*Primary Examiner* — Moin M Rahman

(74) *Attorney, Agent, or Firm* — HAYNES AND BOONE, LLP

(57) ABSTRACT

A semiconductor structure includes a first epitaxial source/drain (S/D) feature disposed over a first semiconductor fin, a second epitaxial S/D feature disposed over a second semiconductor fin and adjacent to the first epitaxial S/D feature, an interlayer dielectric (ILD) layer disposed over the first and the second epitaxial S/D features, a dielectric feature disposed In the ILD layer and contacting the second epitaxial S/D feature, and a conductive feature disposed in the ILD layer and contacting the first epitaxial S/D feature, where a portion of the conductive feature extends to contact the dielectric feature.

20 Claims, 16 Drawing Sheets

(56) References Cited

U.S. PATENT DOCUMENTS

2017/0117411 A1\* 4/2017 Kim ................ H01L 21/823878
2018/0108575 A1\* 4/2018 Li .................... H01L 21/823871
2018/0269297 A1\* 9/2018 Zhang ............... H01L 21/76889
2018/0350662 A1   12/2018 You et al.

\* cited by examiner

100

102 — Provide a semiconductor structure including a first source/drain (S/D) feature, a second S/D feature, and an interlayer dielectric (ILD) layer disposed over the first and the second S/D features.

104 — Form a first dummy contact feature and a second dummy contact feature over the first and the second S/D features, respectively.

106 — Remove portions of the first and the second dummy contact features and the ILD layer disposed therebetween to form a first trench.

108 — Remove remaining portions of the first and the second dummy contact features to form a second trench.

110 — Form a contact feature in the first and the second trenches.

112 — Perform additional processing steps.

FIG. 1

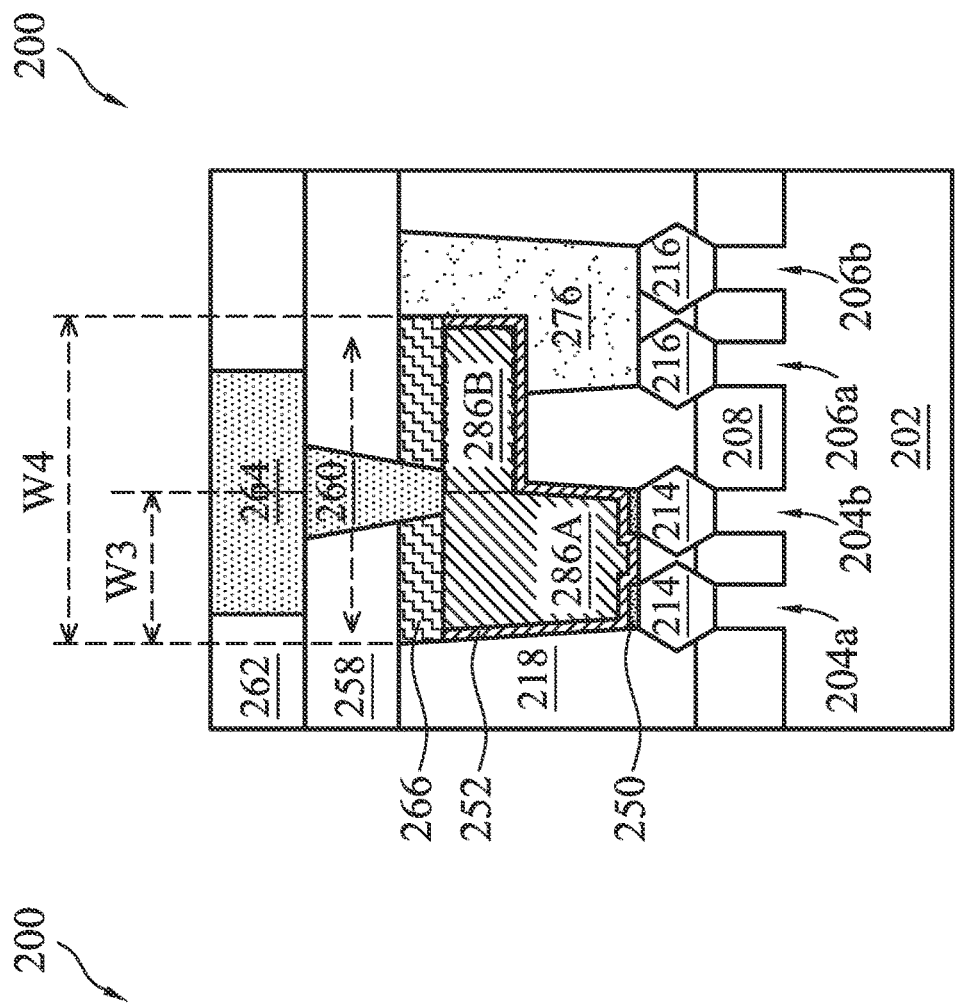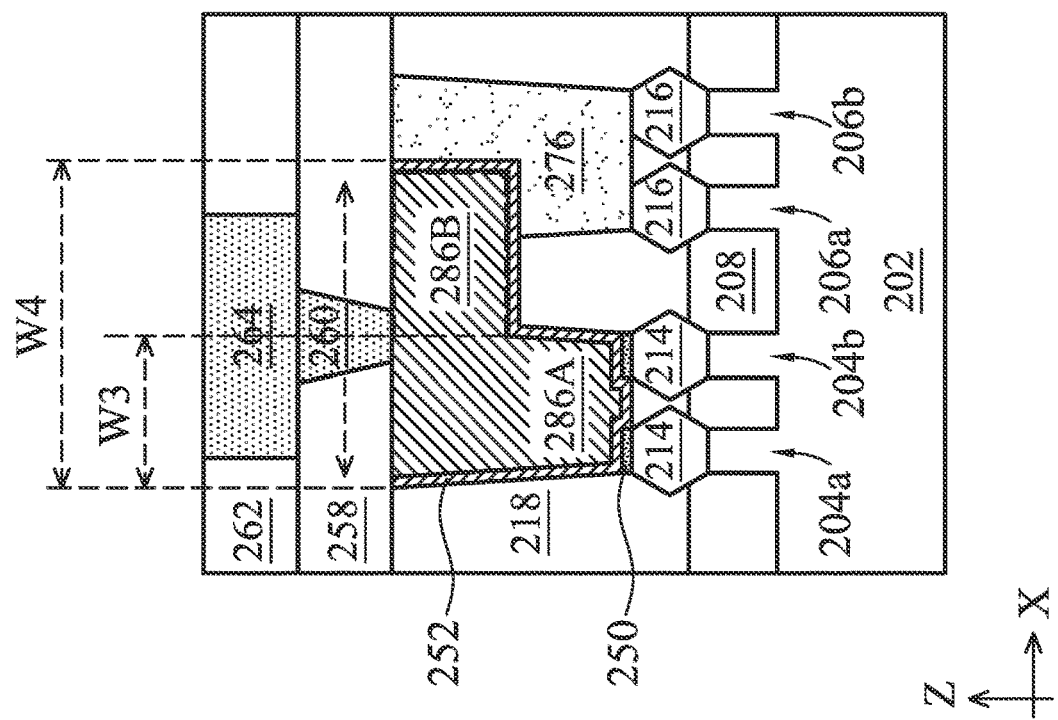

US 11,749,725 B2

METHODS OF FORMING SOURCE/DRAIN CONTACTS IN FIELD-EFFECT TRANSISTORS

CROSS-REFERENCE TO RELATED APPLICATIONS

This application claims priority to U.S. patent application Ser. No. 16/386,853, filed Apr. 17, 2019, which claims priority to U.S. Provisional Patent Application Ser. No. 62/718,783, filed Aug. 14, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of various device-level contacts becomes more challenging as feature sizes continue to decrease. At smaller length scales, formation of device-level contacts may be configured to accommodate and/or to enlarge processing windows for subsequent fabrication steps (e.g., via patterning). While current methods of forming device-level contacts are generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a flow chart of a method of fabricating a semiconductor device according to various aspects of the present disclosure.

FIGS. 14, 15, 16, 17, 18, 19, 20, 21, 22A, 22B, 23A, and 23B are cross-sectional views of an embodiment of the semiconductor device of FIG. 2 along line AA' during intermediate steps of an embodiment of the method of FIG. 13 according to various aspects of the present disclosure.

DETAILED DESCRIPTION

Figure 2:
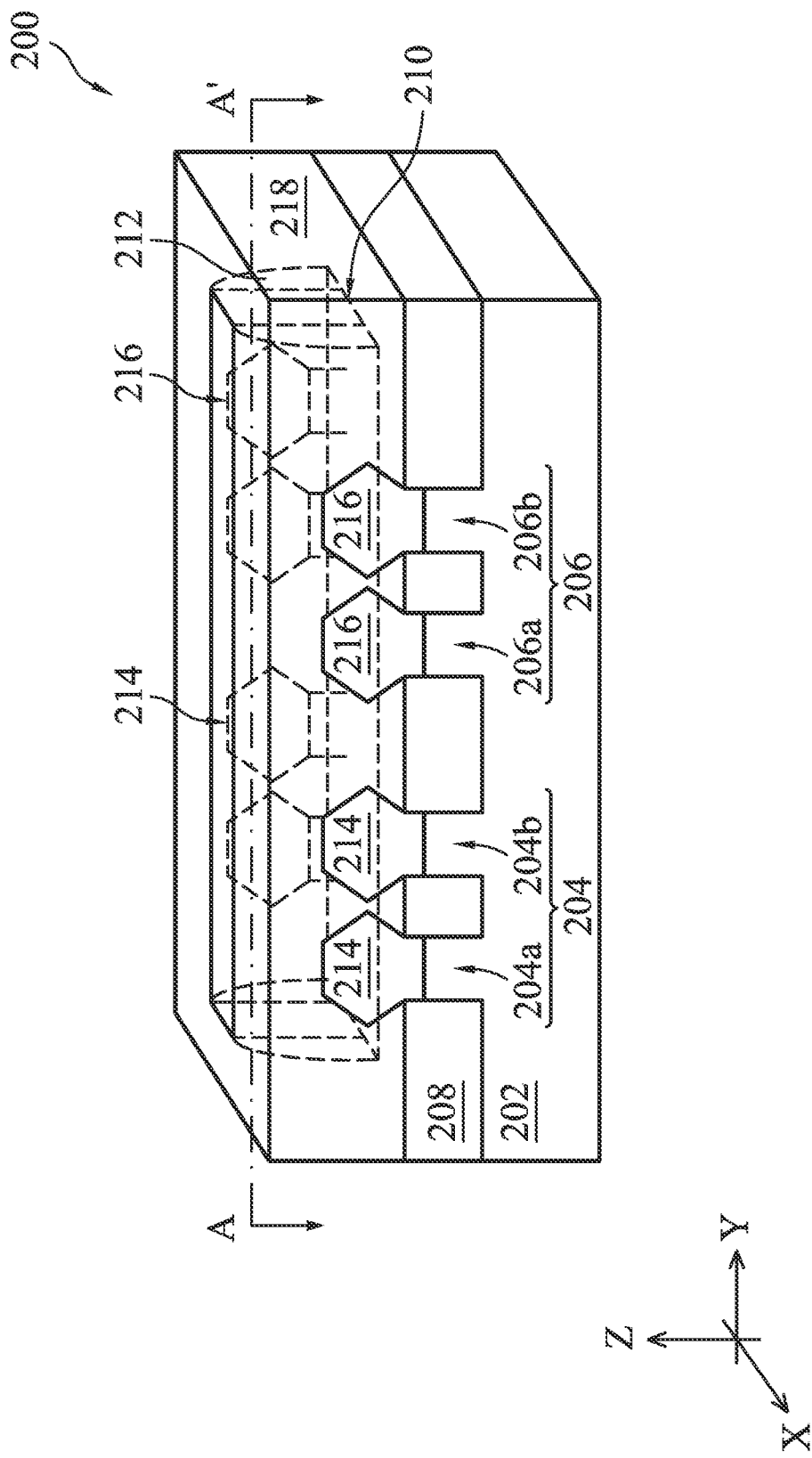
FIG. 2 is a perspective view of an embodiment of a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs or three-dimensional fin-like FETs (FinFETs). It is an objective of the present disclosure to provide methods of forming device-level contacts in FETs.

In FET fabrication, source/drain (S/D) contacts are generally formed to connect device-level S/D features with interconnect features such as vias. When forming S/D contacts over S/D features, it may be desirable to form an S/D contact extension (MDX) across adjacent S/D contacts to accommodate subsequent fabrication processes. In one such example, an MDX electrically connecting two adjacent S/D contacts may enlarge a processing window for performing subsequent patterning processes to form via contacts. However, an MDX is generally formed during a separate process following the formation of the S/D contacts, such that more than one patterning, metallization (deposition of conductive material), and planarization sequence is implemented to form the S/D contacts and the MDX that is disposed over the S/D contacts. Forming the MDX separately from the S/D contacts not only increases processing complexity and costs, but also introduces additional barrier layer interface that may limit device performance. Additionally, forming MDX over the S/D contacts increases an overall height of the S/D contacts, potentially increasing contact resistance of the device. For at least these reasons, improvements in methods of forming MDX and S/D contacts are desired for fabricating FETs with enhanced properties.

Figure 12A:
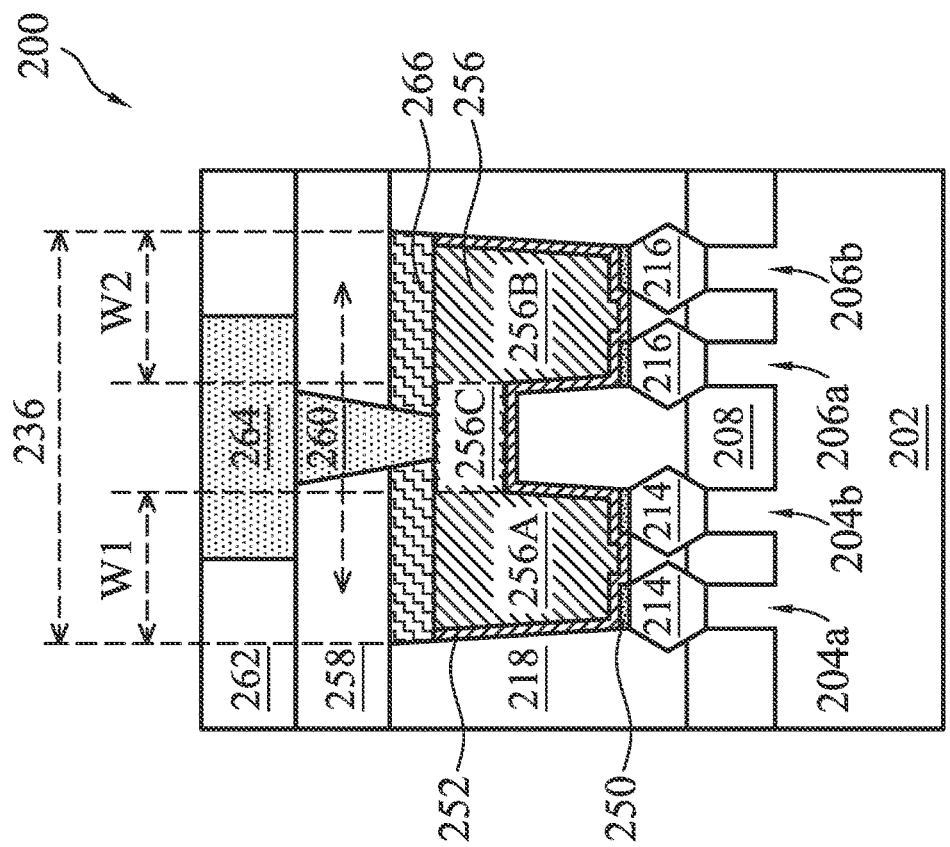
Figure 12B:
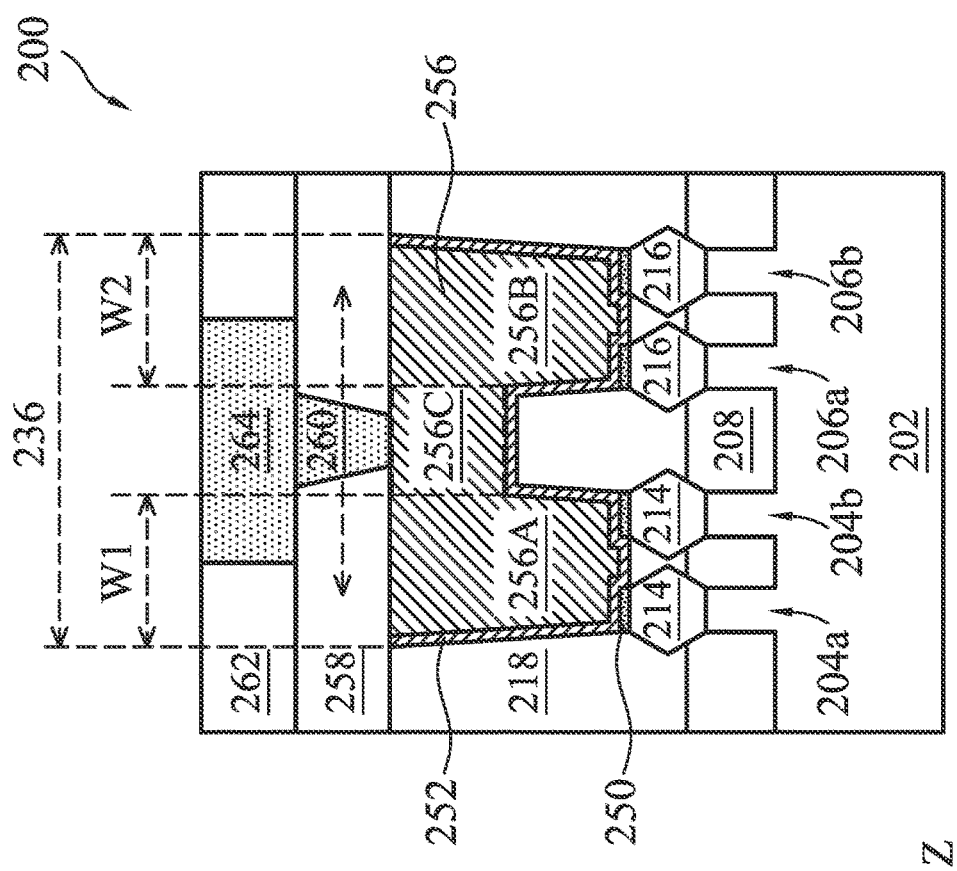
Figure 13:
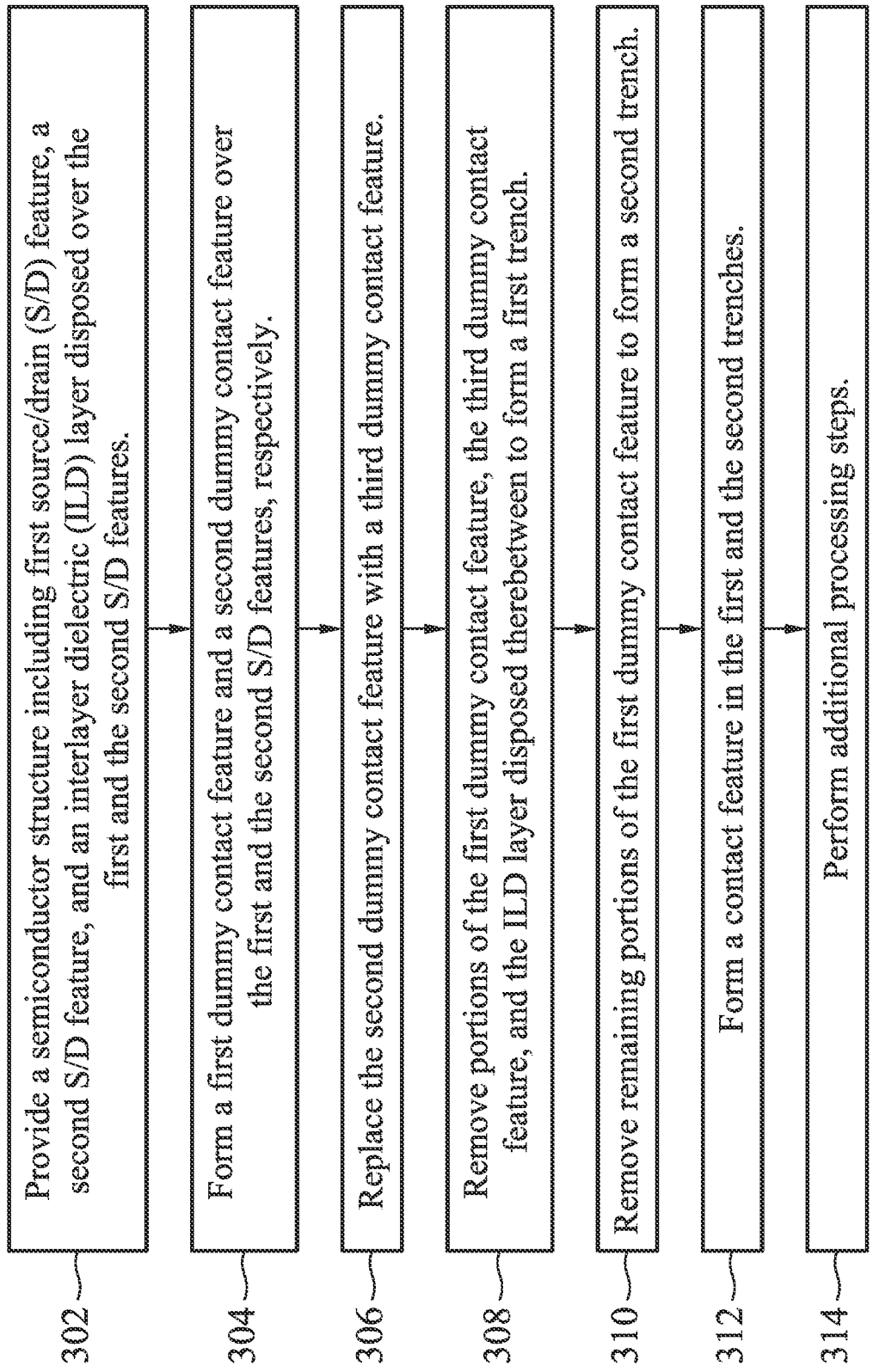
FIG. 13 shows a flow chart of a method of fabricating a semiconductor device according to various aspects of the present disclosure.

FIGS. 1 and 13 illustrate a method 100 and a method 300, respectively, for forming a semiconductor device 200 according to various aspects of the present disclosure. The methods 100 and 300 are merely examples, and are not intended to limit the present disclosure beyond what is explicitly recited in the claims. Additional operations can be provided before, during, and after the methods 100 and 300, and some operations described can be replaced, eliminated, or moved around for additional embodiments of the method. The method 100 is described below in conjunction with FIGS. 2 and 3-12B, which illustrate a portion of the semiconductor device 200 during intermediate steps of the method 100. The method 300 is described below in conjunction with FIGS. 2 and 14-23B, which illustrate a portion of the semiconductor device 200 during intermediate steps of the method 300. FIGS. 3-12B and 14-23B are cross-sectional views of the device 200 taken along dashed line AA' through an S/D region of fins 204a, 204b, 206a, and 206b as illustrated in FIG. 2. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
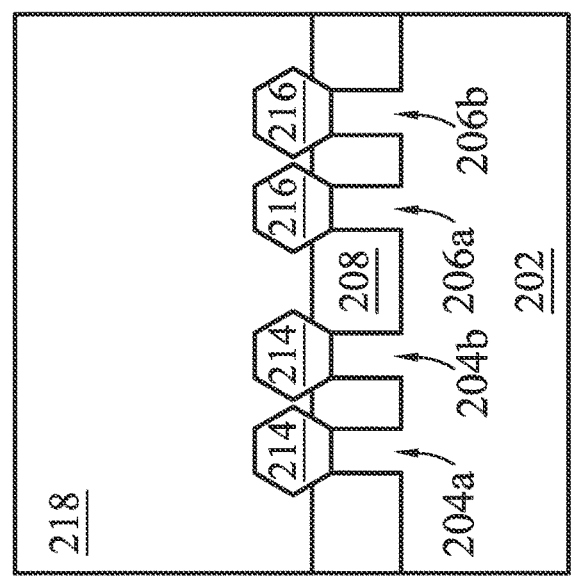

At operation 102, referring to FIGS. 1-3, the method 100 provides a device 200 including a substrate 202 having a first region 204 and a second region 206, where the first region 204 includes two three-dimensional active regions (hereafter referred to as fins) 204a and 204b and the second region 206 includes two fins 206a and 206b. The device 200 further includes a high-k metal gate (HKMG) structure 210 disposed over the first region 204 and the second region 206, gate spacers 212 formed on sidewalls of the HKMG structure 210, S/D features 214 and 216 disposed over the fins 204a (and 204b) and 206a (and 206b), respectively, isolation structures 208 disposed over the substrate 202 separating various components of the device 200, and an interlayer dielectric (ILD) layer 218 disposed over the isolation structures 208 and the S/D features 214 and 216. Although in the depicted embodiment, each of the first region 204 and the second region 206 includes two fins, the present disclosure is not so limited to this configuration. For example, each of the first region 204 and the second region 206 may include one fin or more than two fins. Additionally, the S/D features 214 and 216 may be merged together or separated as depicted.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2-3, the first region 204 may be suitable for providing an n-type FinFET, and the second region 206 may be suitable for providing a p-type FinFET. In alternative embodiments, the first region 204 and the second region 206 may be suitable for providing FinFETs of a similar type, i.e., both n-type or both p-type. This configuration is for illustrative purposes only and is not intended to be limiting. The fins 204a and 204b and the fins 206a and 206b may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204a and 204b and the fins 206a and 206b on the substrate 202. The etching process may include dry etching, wet etching, reactive ion etching (RIE), and/or other suitable processes.

Numerous other embodiments of methods for forming the fins 204a and 204b and the fins 206a and 206b may be suitable. For example, the fins 204a and 204b and the fins 206a and 206b may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204a and 204b and the fins 206a and 206b. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SoG), other suitable methods, or combinations thereof.

Still referring to FIG. 2, the device 200 includes S/D features 214 and 216 disposed over the fins 204a and 204b and the fins 206a and 206b, respectively, each being adjacent to the HKMG structure 210. The S/D features 214 and 216 may be formed by any suitable techniques, such as etching processes followed by one or more epitaxy processes. In one example, one or more etching processes are performed to remove portions of the fins 204a and 204b and the fins 206a and 206b to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the S/D features 214 and 216 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant. In at least one embodiment, the source/drain features 214 include a p-type epitaxial material, while the source/drain features 216 include an n-type epitaxial material; however, the present disclosure is not limited herein.

The device 200 further includes the HKMG structure 210 disposed over a portion of the fins 204a, 204b, 206a, and 206b, such that it interposes S/D features 214 and 216. The HKMG structure 210 includes a high-k (i.e., having a dielectric constant greater than that of silicon oxide; not depicted) dielectric layer disposed over the fins 204a and 204b and the fins 206a and 206b and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable n-type work function materials, or combinations thereof. The bulk conductive layer may include copper (Cu), tungsten (W), aluminum (Al), cobalt (Co), other suitable materials, or combinations thereof. The HKMG structure 210 may further include numerous other layers (not depicted), such as an interfacial layer disposed between the fins 204a and 204b and the fins 206a and 206b and the high-k dielectric layer, hard mask layers, capping layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as chemical mechanical polishing (CMP), may be performed to remove excess materials from a top surface of the HKMG structure 210 to planarize a top surface of the device 200.

The device 200 further includes gate spacers 212 disposed on sidewalls of the HKMG structure 210. The gate spacers 212 may include a dielectric material, such as silicon oxide, silicon nitride, silicon carbide, silicon oxynitride, other suitable dielectric materials, or combinations thereof. The gate spacers 212 may be a single layered structure or a multi-layered structure. The gate spacers 212 may be formed by first depositing a blanket of spacer material over the device 200, and then performing an anisotropic etching process to remove portions of the spacer material to form the gate spacers 212 on sidewalls of the HKMG structure 210. In some embodiments, the device 200 includes a helmet material layer (not depicted) disposed over the metal gate electrode and the gate spacers 212 to protect the HKMG structure 210 from being unintentionally damaged during a subsequent fabrication process. The helmet material layer may include any suitable dielectric material such as, for example, silicon carbonitride, aluminum oxide, aluminum oxynitride, zirconium oxide, zirconium nitride, silicon nitride, zirconium aluminum oxide, and other suitable materials, or combinations thereof.

In many embodiments, the HKMG structure 210 is formed after other components of the device 200(e.g., the S/D features 214 and 216) are fabricated. Such process is generally referred to as a gate replacement process, which includes forming a dummy gate structure (not depicted) as a placeholder for the HKMG structure 210, forming the S/D features 214 and 216, forming the ILD layer 218 (and optionally a contact etch-stop layer, or CESL) over the dummy gate structure and the S/D features 214 and 216, planarizing the ILD layer 218 by, for example, CMP, to expose a top surface of the dummy gate structure, removing the dummy gate structure in the ILD layer 218 to form a trench that exposes a channel region of the fins 204a and 204b and the fins 206a and 206b, and forming the HKMG structure 210 in the trench to complete the gate replacement process. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the ILD layer 218 includes an oxide-containing dielectric material. The ILD layer 218 may include a multi-layer structure having multiple dielectric materials and may be formed by a deposition process such as, for example, CVD, flowable CVD (FCVD), spin-on-glass (SOG), other suitable methods, or combinations thereof. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 4:
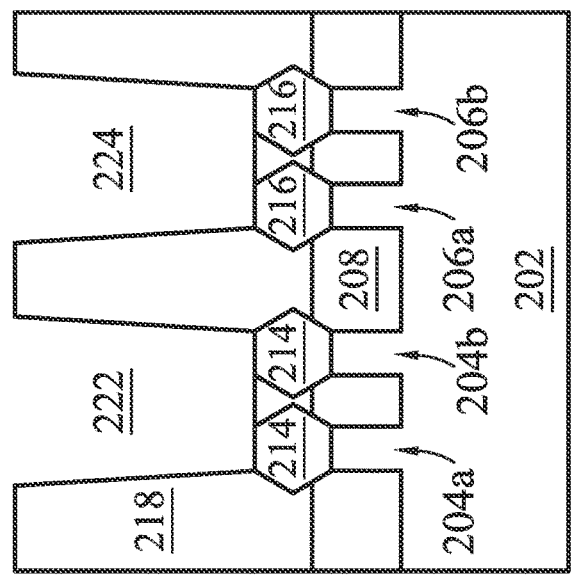
FIGS. 3, 4, 5, 6, 7, 8, 9, 10, 11A, 11B, 12A, and 12B are cross-sectional views of an embodiment of the semiconductor device of FIG. 2 along line AA' during intermediate steps of an embodiment of the method of FIG. 1 according to various aspects of the present disclosure.
Figure 6:
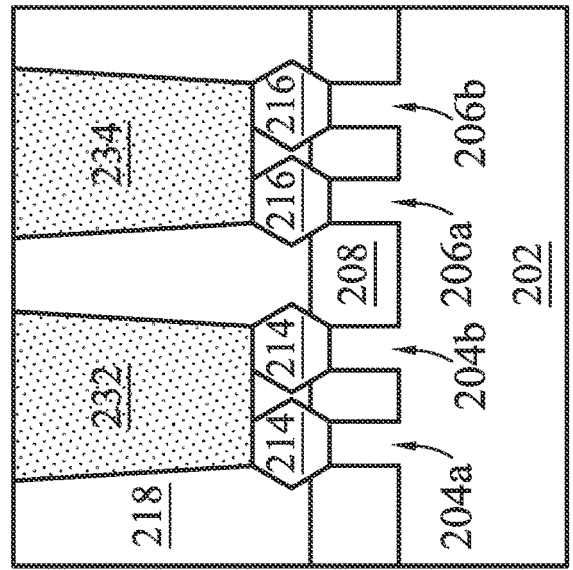
Figure 5:
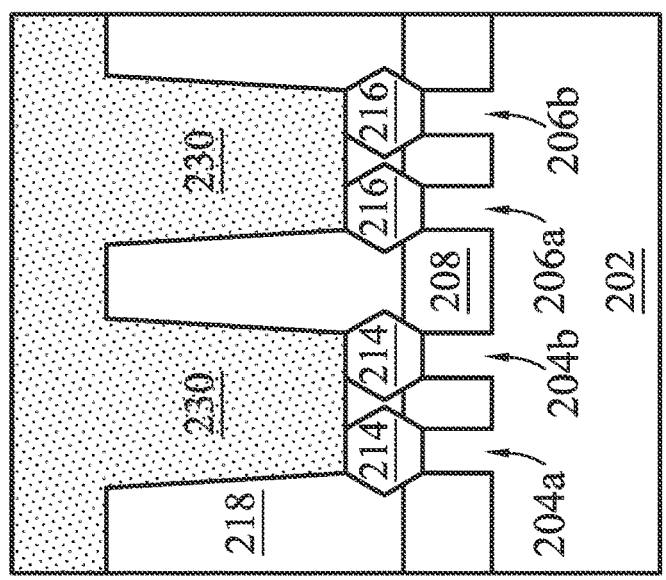

At operation 104, collectively referring to FIGS. 4-6 the method 100 forms a dummy S/D contact 232 and a dummy S/D contact 234 over the S/D features 214 and 216, respectively. Specifically, referring to FIG. 4, the method 100 forms a trench 222 and a trench 224 in the ILD layer 218 over the S/D features 214 and 216, respectively, by performing a series of patterning and etching processes. In an example embodiment, the series of patterning and etching processes include forming a masking element (not shown) including a resist (e.g., photoresist) layer configured to be patterned by a lithography process over the ILD layer 218 to expose portions of the ILD layer 218 to be etched, and subsequently etching the ILD layer 218 in a dry etching, wet etching, reactive ion etching (RIE), other suitable etching processes, or combinations thereof to expose the S/D features 214 and 216 in the trenches 222 and 224, respectively. In some embodiments, the etching process is a dry etching process that employs one or more etchant, such as a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, an oxygen-containing gas (e.g., $O_2$), a nitrogen-containing gas (e.g., $N_2$), oxygen, helium, argon, other suitable gases, or combinations thereof. In the depicted embodiment, the dry etching process employs one or more fluorine-containing etching gas configured to remove portions of the ILD layer 218 exposed by the masking element. After performing the etching process, the masking element is removed by any suitable method, such as plasma ashing or resist stripping.

Referring to FIG. 5, the method 100 then fills the trenches 222 and 224 with a dielectric material 230, portions of which are also deposited over a top surface of the ILD layer 218. The dielectric material 230 may include any suitable dielectric material, such as, for example, a carbon-containing material (e.g., spin-on carbon (SOC), amorphous carbon, etc.), an oxygen-containing material (e.g., silicon oxide, spin-on glass (SOG), a metal oxide, etc.), a nitrogen-containing material (e.g., silicon nitride, a metal nitride, etc.), other suitable dielectric materials, or combinations thereof. In many embodiments, the dielectric material 230 is different from the dielectric material included in the ILD layer 218, such that when subjected to an etching process, the dielectric material 230 and the ILD layer 218 may be etched at different rates relative to each other. Referring to FIG. 6, the method 100 planarizes a top surface of the device 200 and removes excess dielectric material 230 disposed on the top surface of the ILD layer 218 by a suitable process such as CMP, thereby forming the dummy S/D contacts 232 and 234 over the S/D features 214 and 216, respectively.

Figure 7:
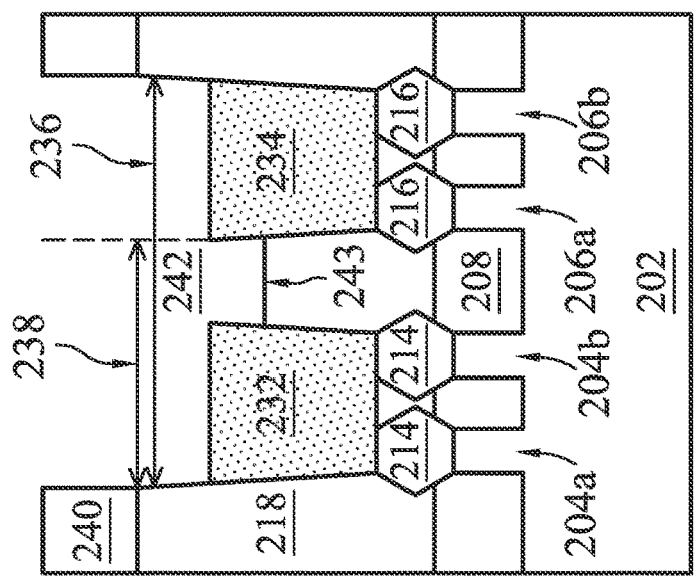

Referring now to FIG. 7, the method 100 at operation 106 removes portions of the dummy S/D contacts 232 and 234, as well as a portion of the ILD layer 218 disposed therebetween to form a trench 242. In many embodiments, the operation 106 is implemented by a series of patterning and etching processes similar to that described with reference to FIG. 4 at operation 104. In an example embodiment, a masking element 240 may be formed over the ILD layer 218 and the dummy S/D contacts 232 and 234 to expose portions of the device 200 to be etched. The masking element 240 includes a resist (e.g., photoresist) material configured to be patterned by one or more lithography processes. Thereafter, the method 100 performs an etching process to remove portions of the dummy S/D contacts 232 and 234, as well as a portion of the ILD layer 218 disposed therebetween exposed by the masking element 240. The etching process may be a dry etching process, a wet etching process, an RIE process, other suitable processes, or combinations thereof. In many embodiments, the etching process is a dry etching process. In the depicted embodiment, similar to the operation 104, the dry etching process at the operation 106 employs one or more fluorine-containing gas (e.g., $CF_4$, $SF_6$, $CH_2F_2$, $CHF_3$, and/or $C_2F_6$) to remove portions of the dummy S/D contact 232 and 234 and a portion of the ILD layer 218 disposed therebetween. In many embodiments, the dielectric material 230 included in the dummy S/D contacts 232 and 234 is etched at a lower rate than the ILD layer 218, such that a greater amount of the ILD layer 218 than the dummy S/D contacts 232 and 234 is removed by the etching process. However, the present disclosure is not limited so and may, for example, remove a greater amount of the dummy S/D contacts 232 and 234 than the ILD layer 218. Regardless of their relative amounts of etching, at least a portion of the ILD layer 218 disposed between the dummy S/D contacts 232 and 234 remains in the device 200 following the etching process, i.e., a bottom surface 243 of the trench 242 defined by the ILD layer 218 is above the top surface of the S/D features 214 and 216. In other words, the etchant chosen for performing the etching process at operation 106 is configured to remove both the dielectric material 230 and the ILD layer 218.

Still referring to FIG. 7, an opening of the trench 242 is at least a separation distance 238 measured from the outer sidewall of the dummy S/D contact 232 to an inner sidewall of the dummy S/D contact 234. In some embodiments, the opening of the trench 242 is as wide as a width 236 that spans from an outer sidewall of the dummy S/D contact 232 to an outer sidewall of the dummy S/D contact 234, such that sidewalls of the trench 242 are defined by the ILD layer 218. In other words, the opening of the trench 242 is not limited to a particular width so long as it exposes a portion of the dummy S/D contact 232 and/or a portion of the dummy S/D contact 234, and may vary depending on design requirement. The width of the trench 242 may be adjusted by tuning an opening formed in the masking element 240 during the patterning process.

Figure 8:
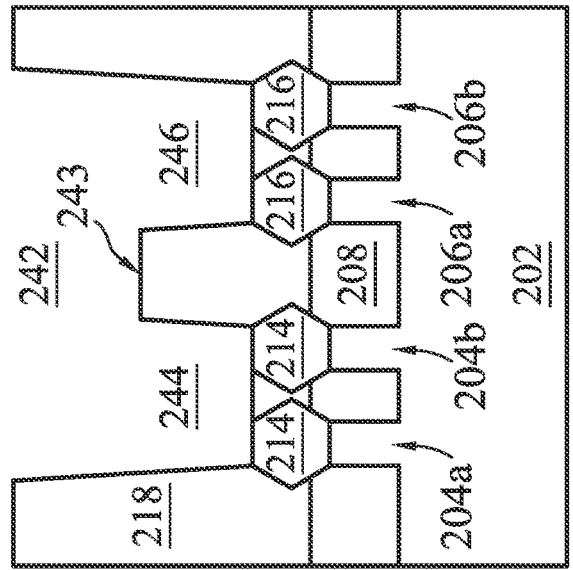

Referring to FIG. 8, the method 100 at operation 108 selectively removes the remaining portions of the dummy S/D contacts 232 and 234 relative to the ILD layer 218 to form a trench 244 and a trench 246 that expose the S/D features 214 and 216, respectively. In many embodiments, the trench 242 connects the trenches 244 and 246 along the X direction. Notably, the bottom surface 243 is disposed above the top surfaces of the S/D features 214 and 216 but below the top surface of the ILD layer 218. In other words, the bottom surface 243 of the trench 242 is above a bottom surface of the trenches 244 and 246, respectively. The etching process performed at operation 108 may be a dry etching process, a wet etching process, an RIE process, other suitable processes, or combinations thereof. In many embodiments, the etching process is a dry etching process that employs one or more etchant different from that employed for the operations 104 and 106. In an example embodiment, the dry etching process at the operation 108 employs an oxygen-containing etchant, such as $O_2$, to selectively remove the dielectric material 230 in the dummy S/D contacts 232 and 234 relative to the ILD layer 218. Also different from the etching process at operation 106, the etching process at operation 108 may not employ a masking element to remove the dummy S/D contacts 232 and 234. Instead, the etching process at operation 108 is implemented using an etchant configured to etch the dummy S/D contacts 232 and 234 (i.e., the dielectric material 230) at a greater rate than the dielectric material included in the ILD layer 218, such that the dummy S/D contacts 232 and 234 are etched while the ILD layer 218 is not etched or minimally etched. In one example, the etching selectivity of the dummy S/D contact 232 relative to the ILD layer 218 may be at least 2.

Collectively referring to FIGS. 9-11B, the method 100 at operation 110 forms an S/D contact 256 in the trenches 242, 244, and 246. In many embodiments, the S/D contact 256 electrically connects the S/D features 214 and 216 to additional components of the device 200 formed afterwards, such as, for example, interconnect features (e.g., vias).

Figure 9:
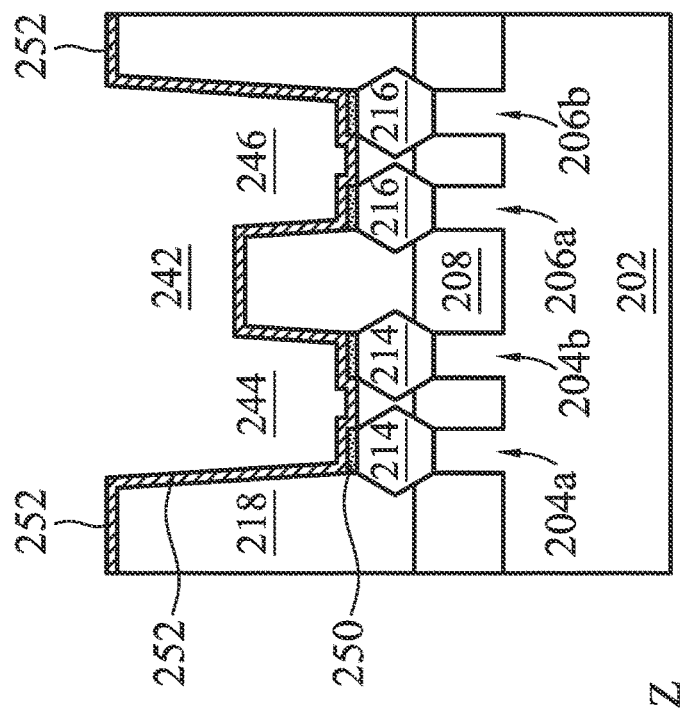

Before forming the S/D contact 256, referring to FIG. 9, the method 100 at operation 110 may first form a silicide layer 250 over the S/D features 214 and 216. In many embodiments, the silicide layer 250 includes nickel silicide, cobalt silicide, tungsten silicide, tantalum silicide, titanium silicide, platinum silicide, erbium silicide, palladium silicide, other suitable silicide, or combinations thereof. The silicide layer 250 may be formed by a deposition process such as CVD, ALD, PVD, other suitable processes, or combinations thereof. For example, a metal layer (e.g., nickel) may be deposited over the S/D features 214 and 216. Then, the device 200 is annealed to allow the metal layer and the semiconductor materials of the S/D features 214 and 216 to react. Thereafter, the un-reacted metal layer is removed, leaving the silicide layer 250 over the S/D features 214 and 216.

Thereafter, still referring to FIG. 9, the method 100 at operation 110 may conformally form a barrier layer 252 in the trenches 242, 244, and 246, and over the silicide layer 250 (if formed). In many embodiments, the barrier layer 252 includes a metal, such as Ti, Ta, other suitable metals, or combinations thereof, and/or a metal nitride, such as TiN, TaN, other suitable nitride materials, or combinations thereof. The barrier layer 252 may be formed by a deposition process such as CVD, ALD, PVD, other suitable processes, or combinations thereof. In some embodiments, the barrier layer 252 may include at least one material layer.

Figure 10:
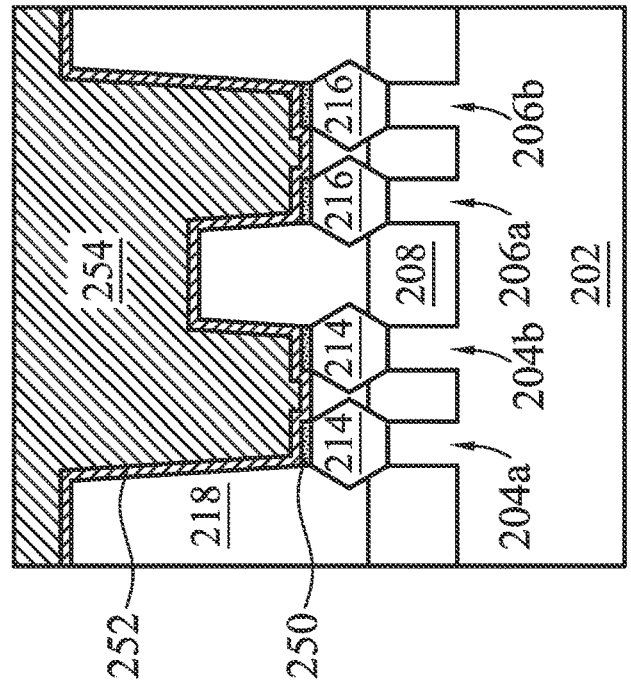

Referring to FIG. 10, the method 100 deposits a conductive material 254 in the trenches 242, 244, and 246. The conductive material 254 may include any suitable material, such as W, Co, Ru, Cu, Ti, Al, Ni, Au, Pt, Pd, other suitable conductive materials, or combinations thereof, and may be formed by any suitable method, such as CVD, ALD, PVD, plating, other suitable processes, or combinations thereof.

Figures 11A, 11B:
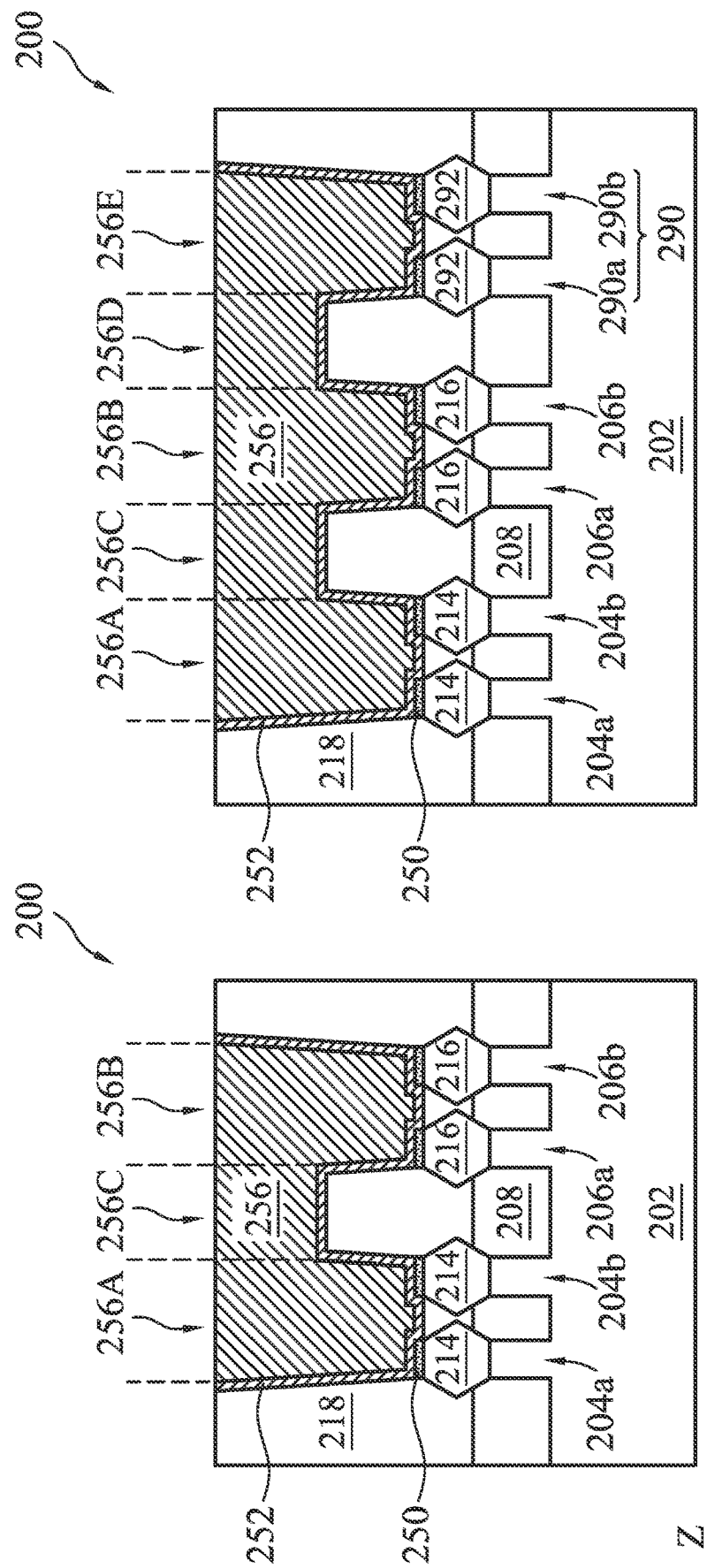

Thereafter, referring to FIG. 11A, the method 100 may remove excess conductive material 254 formed on the top surface of the ILD layer 218 in a planarization process (e.g., a CMP process) to form the S/D contact 256. The S/D contact 256 may include three portions: a portion 256A disposed over and having a bottom surface defined by the S/D features 214, a portion 256B disposed over and having a bottom surface defined by the S/D features 216, and a portion 256C having a bottom surface defined by the ILD layer 218. As depicted in FIG. 11A, the portions 256A and 256B are connected by the portion 256C, where the portion 256C's bottom surface is above the bottom surfaces of the portions 256A and 256B. In the depicted embodiment, the portion 256C constitutes a portion of an MDX between the portions 256A and 256B, which are configured as S/D contacts for the S/D features 214 and 216, respectively.

FIG. 11B depicts an embodiment similar to that of FIG. 11A, except that the S/D contact 256 spans to contact the S/D features 214, 216, and 292, where the S/D features 292 are disposed over a fin 290a and a fin 290b in a third region 290. In the depicted embodiment, the third region 290 is disposed adjacent the second region 206 along the X direction. Similar to the three portions by which the S/D contact 256 may be described according to FIG. 11A, the embodiment illustrated in FIG. 11B may be described by portions 256A-256C as well as a portion 256D and a portion 256E, where the portion 256E is disposed over the S/D features 292 (and/or the silicide layer 250 formed thereover) and the portion 256D connects the portion 256E to the portion 256B.

Generally, an MDX may be formed as an additional conductive layer above adjacently disposed S/D contacts in contact with underlying S/D features after the S/D contacts are formed in a series of patterning, deposition (e.g., metallization), and planarization (e.g., CMP) processes. In other words, the MDX structurally connects the adjacent S/D contacts in a lateral direction (e.g., along the X direction) and extends the adjacent S/D contacts in a vertical direction (e.g., along the Z direction), such that an effective height of the S/D contacts is increased vertically. As the formation of S/D contacts and MDX is generally preceded by formation of one or more barrier layers (e.g., the barrier layer 252) that are generally less conductive than the material included in the S/D contacts and the MDX, such vertical extension by the MDX also introduces additional barrier layer interfaces between the S/D contacts and the MDX. In many instances, the increase of the height of the S/D contacts and the introduction of additional barrier layer interface may decrease device performance in terms of, for example, increased contact resistance of the S/D contacts. Additionally, forming the MDX after forming the S/D contacts may require additional metallization processes that may inevitably increase processing complexity and costs. Embodiments of the present disclosure seek to mitigate such impact on device performance and to reduce processing complexity by forming S/D contacts (e.g., the S/D contact 256) with built-in extension features (e.g., the portion 256C) that may be formed together with the S/D contacts (e.g., the portions 256A and 256B) disposed over the S/D features (e.g., S/D features 214 and 216). In some embodiments, the built-in extension features and the S/D contacts are formed together by depositing a conductive material at the same time as will be discussed in detail below.

Referring to FIG. 12A, the method at operation 112 performs additional processing steps to the device 200. For example, the method 100 may form vertical interconnect features such as a via 260 in an ILD layer 258 disposed over the S/D contact 256 and the ILD layer 218. The via 260 may include a conductive material similar to the conductive material 254 as described above, and the ILD layer 258 may include a similar dielectric material as the ILD layer 218 as described above. The via 260 may be formed by first depositing the ILD layer 258 over the S/D contact 256 and the ILD layer 218, then performing a series of patterning and etching processes similar to those described with respect to operation 104 to form a trench (not depicted) in the ILD layer 258, and depositing a conductive material similar to the conductive material 254 in the trench to form the via 260. Furthermore, as depicted in FIG. 12A, the method 100 at operation 112 may form additional interconnect features such as conductive line 264 in an ILD layer 262 disposed over the ILD layer 258. The conductive line 264 may be formed together with the via 260 in a series of patterning and etching processes (e.g., a dual damascene process), or it may be formed after the forming of the via 260.

In addition to the advantages discussed above, if the portions 256A and 256B disposed over the S/D features 214 and 216, respectively, are not connected by the portion 256C, or the MDX, a processing window (e.g., margin of error tolerated during the patterning process) for the via 260 may be restricted to a width W1 or a width W2, which each defines an opening for the S/D contact. However, with the formation of the MDX, the processing window for patterning the via 260 may be enlarged to the width 236, which is greater than W1 and W2, such that the patterning process of the via 260 and/or the conductive line 264 may be allowed greater margin of error for any possible misalignment without affecting the electrical connection between the interconnect structures and the FETs disposed therebelow.

Referring to FIG. 12B, before forming the via 260, the method 100 at operation 112 may etch back a portion of the S/D contact 256 (including the portions 256A, 256B, and/or 256C) and a portion of the barrier layer 252 to form a trench (not depicted), and deposit a dielectric material layer 266 in the trench to accommodate additional processing steps. The dielectric material layer 266 may be planarized following the deposition process. The via 260 is then formed by patterning the ILD layer 258 and the dielectric material layer 266 similar to the process discussed above. In some embodiments, the dielectric material layer 266 is configured to provide sufficient etching selectivity (e.g., greater than 10) relative to the helmet material layer formed over the HKMG structure 210 and the gate spacers 212. In other words, a composition of the dielectric material layer 266 formed over the S/D contact 256 is different from a composition of the helmet material and the gate spacers 212 as discussed above. In many embodiments, such etching selectivity ensures that when forming additional interconnect structures (e.g., the via 260) over the S/D contact 256, misalignment during the patterning process does not damage the HKMG structure 210, which could lead to shorting between the HKMG structure 210 and the interconnect structures. In some embodiments, the dielectric material layer 266 is configured to accommodate a self-aligned contact formation process.

Now referring to FIGS. 13-23B, the present disclosure provides the method 300 for forming the device 200. The method 300 is similar, but not identical, to the method 100 in some aspects. Accordingly, for purposes of simplicity, features common to both the methods 100 and 300 are referred to by the same numeric references. In some embodiments, the method 300 differs from the method 100 in that the method 300 is configured to form a device in which only one of two adjacent S/D contacts, such as an external node, is connected with additional interconnect structures (e.g., a via), while the other of the two adjacent S/D contacts, such as an internal node, is insulated from additional interconnected structures.

Figure 14:
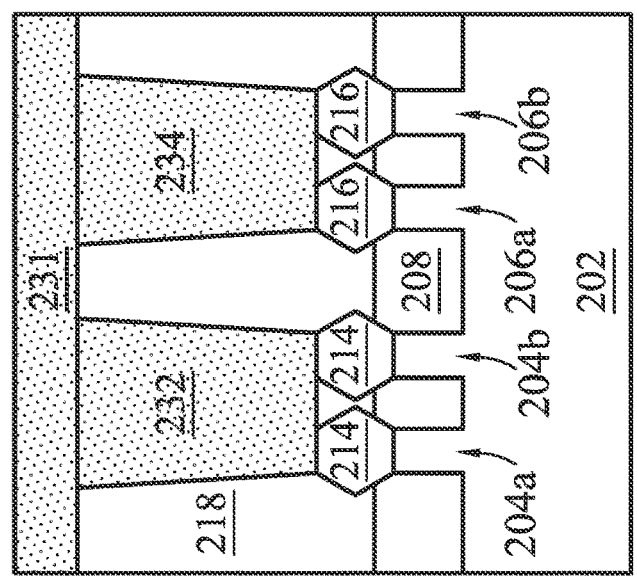

Referring to FIG. 14, the method 300 at operation 302 provides a device 200 substantially similar to the device 200 depicted in FIG. 3. Thereafter, at operation 304, still referring to FIG. 14, the method 300 forms a trench (not depicted) over each of the S/D features, similar to the S/D features 214 and 216 discussed above, by a series of patterning and etching processes discussed above with respect to the operation 104, and deposits a dielectric material, similar to the dielectric material 230 discussed in detail above, in the trench to form dummy S/D contacts 232 and 234. In the depicted embodiment, a portion 231 of the dielectric material 230 is deposited over a top surface of the device 200.

Figure 15:
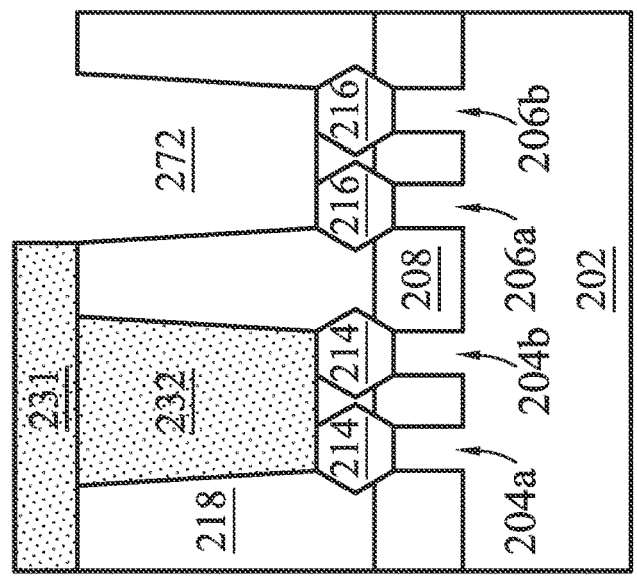
Figure 17:
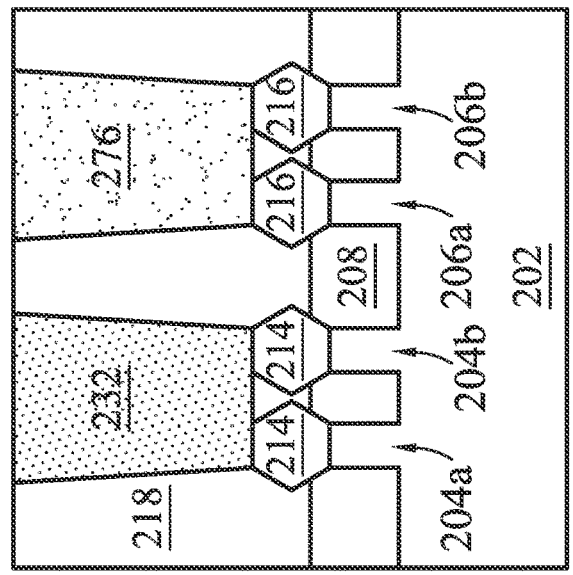
Figure 16:
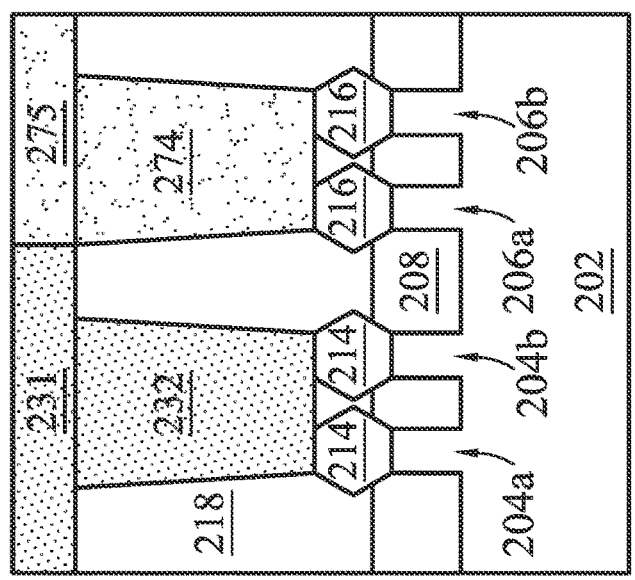

Referring to FIGS. 15-17, the method 300 at operation 306 replaces one of the dummy S/D contacts 232 and 234 with another dummy S/D contact 276 that includes a dielectric material 274 different from the dielectric material 230. In the depicted embodiment, referring to FIG. 16, a portion 275 of the dielectric material 274 is deposited over a top surface of the device 200. In some embodiments, one of the dummy S/D contacts 232 and 234 is first removed by a series of patterning and etching processes to form a trench 272 in a series of processes similar to that discussed above with reference to the operation 104. For example, a masking element (not depicted) including a resist material may be formed over the device 200, and the masking element may then be patterned to expose one of the dummy S/D contacts 232 and 234 to be removed. Thereafter, one of the dummy S/D contacts 232 and 234 may be removed by one or more etching process, such as a dry etching process, utilizing one or more etchant, such as an oxygen-containing etchant (e.g., $O_2$), similar to that employed in the operation 108 as discussed above.

Thereafter, the method 300 deposits the dielectric material 274 in the trench 272 and performs one or more planarization process (e.g., CMP) to remove the portions 231 and 275 from the top surface of the device 200. The dielectric material 274 is different from the dielectric material 230 and may include, for example, an oxygen-containing dielectric material (e.g., silicon oxide, spin-on glass (SOG), a metal oxide, etc.). For example, the dielectric material 230 may be a carbon-containing material (e.g., SOC) and the dielectric material 274 may be an oxygen-containing material (e.g., SOG). It is not necessary for the dielectric material 274 to be different from the dielectric material included in the ILD layer 218, as etching selectivity between the two is not required in subsequent processing steps. The dielectric material 274 may be deposited by any suitable method, such as CVD, FCVD, SOG, PVD, ALD, chemical oxidation, other suitable methods, or combinations thereof. In the depicted embodiment, the dielectric material 274 is deposited using a low-temperature FCVD process to ensure that thermal damage to the S/D features 216 is minimized. Thereafter, the method 300 performs one or more planarization process to form a dummy S/D contact 276 over one of the S/D features 214 and 216 but not the other. For example, in the depicted embodiment, the dummy S/D contact 234 disposed above the S/D features 216 is replaced with the dummy S/D contact 276; however, the method 300 may also replace the dummy S/D contact 232 with the dummy S/D contact 276 instead.

Figure 18:
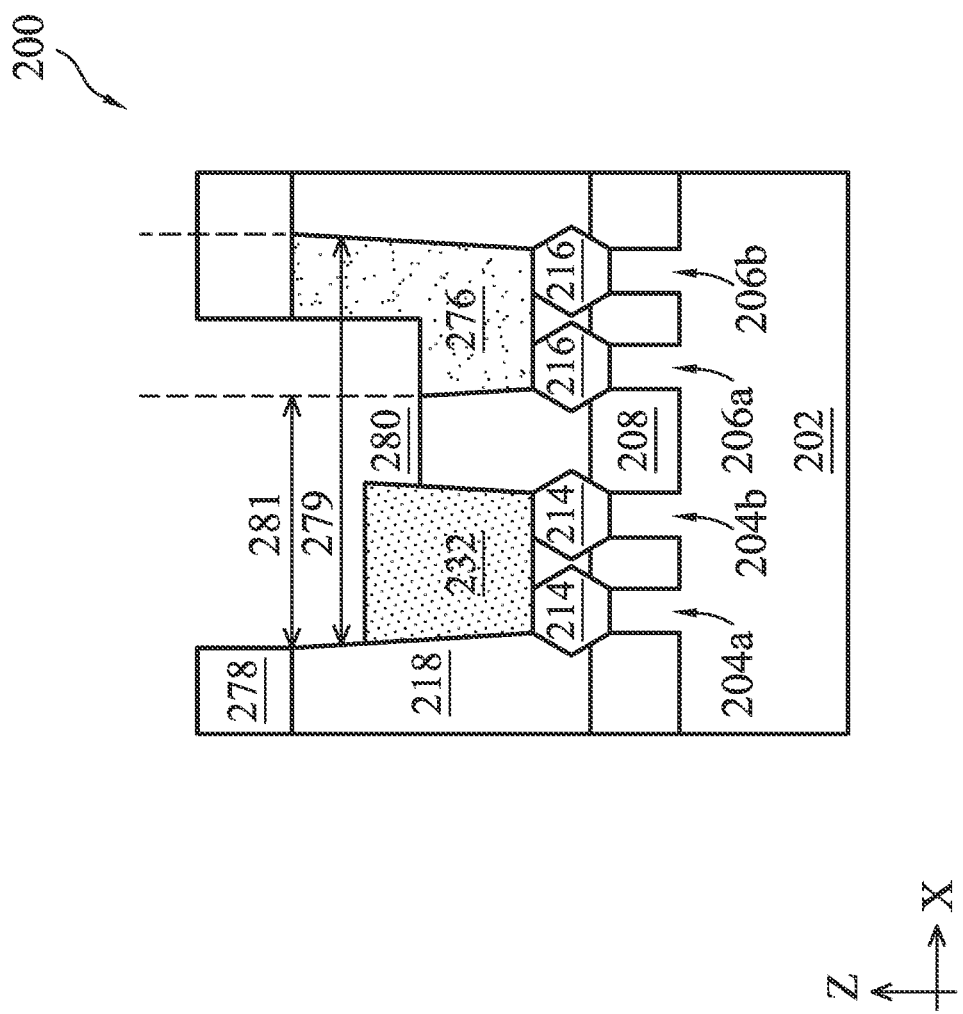
Figure 20:
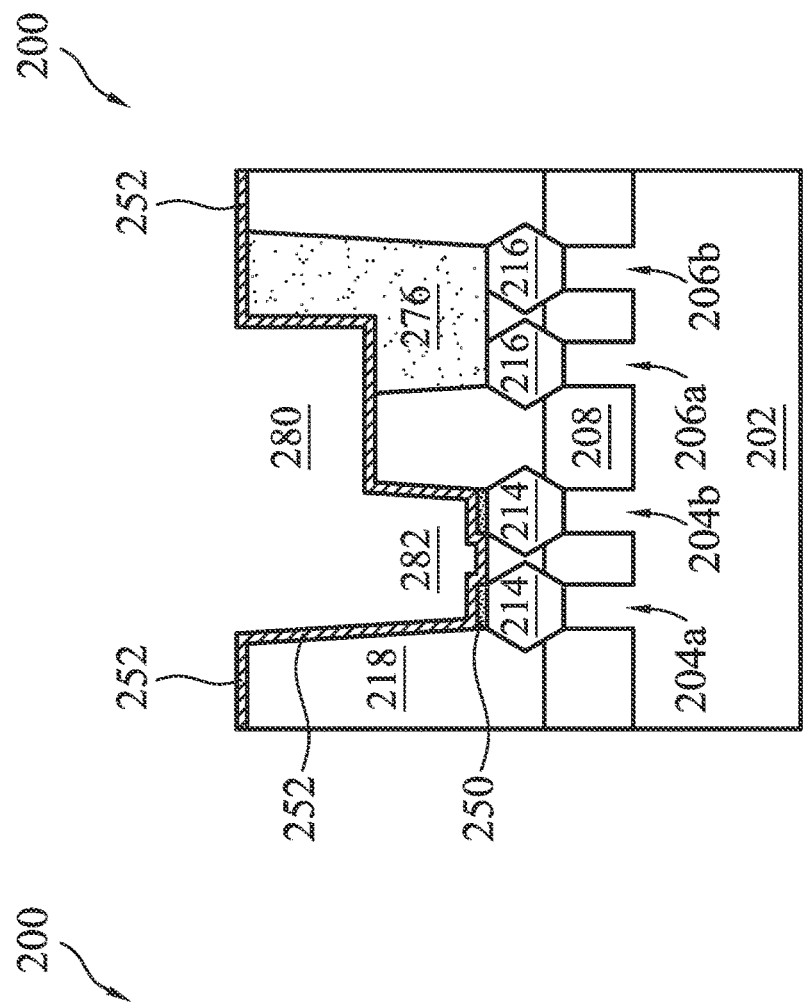

Referring to FIG. 18, the method 300 at operation 308 removes portions of the dummy S/D contacts 232 and 276, as well as a portion of the ILD layer 218 disposed therebetween to form a trench 280. The trench 280 may be formed by a series of patterning and etching processes as discussed above with respect to the operation 106 utilizing, for example, a masking element 278 to expose portions of the device 200 to be etched. Notably, because the dummy S/D contact 232 includes a dielectric material different from that included the ILD layer 218 and/or the dummy S/D contact 276, a rate at which the dummy S/D contact 232, the ILD layer 218, and/or the dummy S/D contact 276 are removed may differ, such that the relative amount of each of the features removed by the etching process at operation 308 may also differ. For example, in the depicted embodiment, the ILD layer 218 and the dummy S/D contact 276 are etched at a higher rate than the dummy S/D contact 232. However, similar to the operation 106, it is not necessary that the etchant chosen to etch the dummy S/D contacts 232 and 276 and the ILD layer 218 is particularly selective toward the dielectric material 230, the dielectric material 274, or the dielectric material included in the ILD layer 218, but that the trench 280 may be formed in the configuration discussed in detail below. Thereafter, the masking element 278 is removed from the device 200 by any suitable method, such as plasma ashing or resist stripping.

In some embodiments, similar to the description with respect to the trench 242, an opening of the trench 280 is at least a separation distance 281 measured from the outer sidewall of the dummy S/D contact 232 to an inner sidewall of the dummy S/D contact 276. In some examples, the opening of the trench 280 may be defined by a width 279 that spans from an outer sidewall of the dummy S/D contact 232 to an outer sidewall of the dummy S/D contact 276, such that sidewalls of the trench 280 are defined by the ILD layer 218. In other words, the opening of the trench 280 is not limited to a particular width but may vary depending on design requirement. The width of the trench 280 may be adjusted by tuning an opening formed in the masking element 278 during the patterning process.

Figure 19:
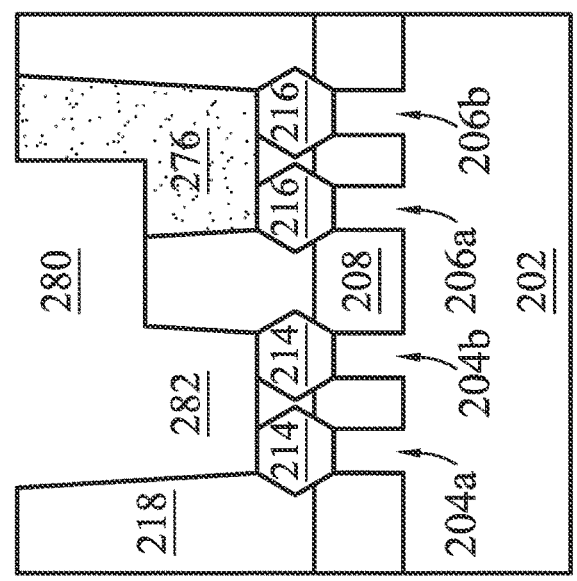
Figure 21:
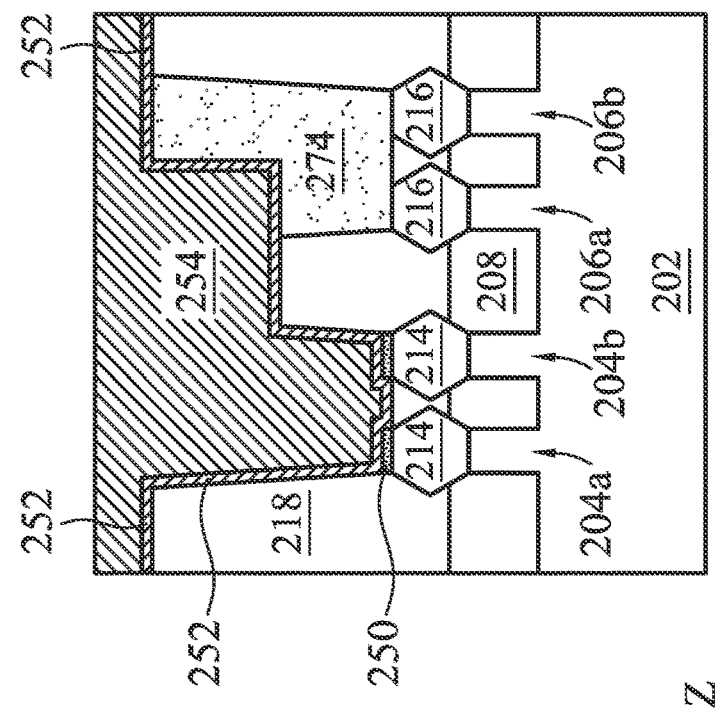

Referring to FIG. 19, the method 300 at operation 310 selectively removes the remaining portion of the dummy S/D contact 232 relative to the ILD layer 218 and the dummy S/D contact 276 to form a trench 282 that exposes the S/D features 214. In many embodiments, the trench 282 is formed by an etching process, such as a dry etching process, a wet etching process, an RIE process, other suitable processes, or combinations thereof. In many embodiments, the etching process is a dry etching process that employs an oxygen-containing etching gas, such as $O_2$.

Different from the etching process at operation 308, the etching process at operation 310 removes the dummy S/D contact 232 at a higher rate than the ILD layer 218 and the dummy S/D contact 276. In other words, the etching process at operation 310 selectively removes the dummy S/D contact 232 relative to the ILD layer 218 and the dummy S/D contact 276, such that the ILD layer 218 and the dummy S/D contact 276 are not etched or minimally etched. For example, the etching selectivity of the dummy S/D contact 232 relative to the ILD layer 218 and the dummy S/D contact 276 may be at least 2. In some embodiments, the operation 310 performs the etching process without the use of a masking element.

Figure 22A:
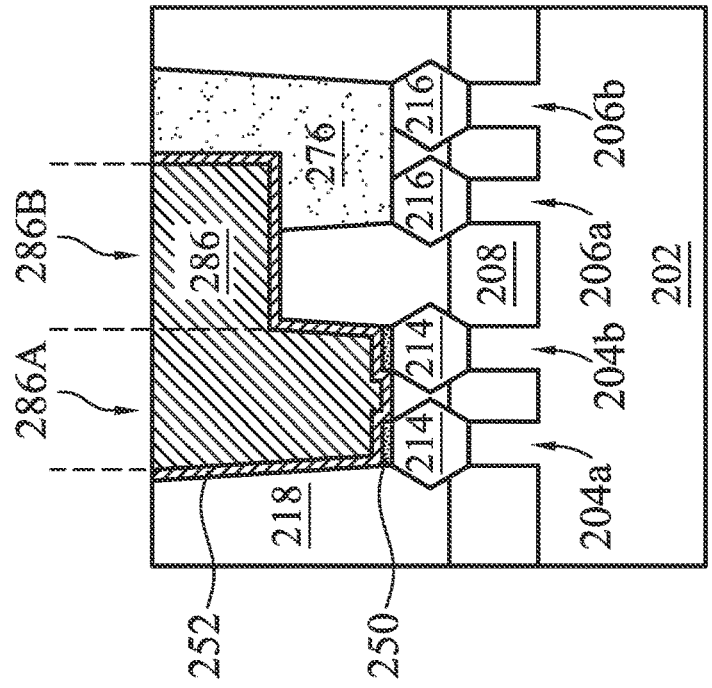
Figure 22B:
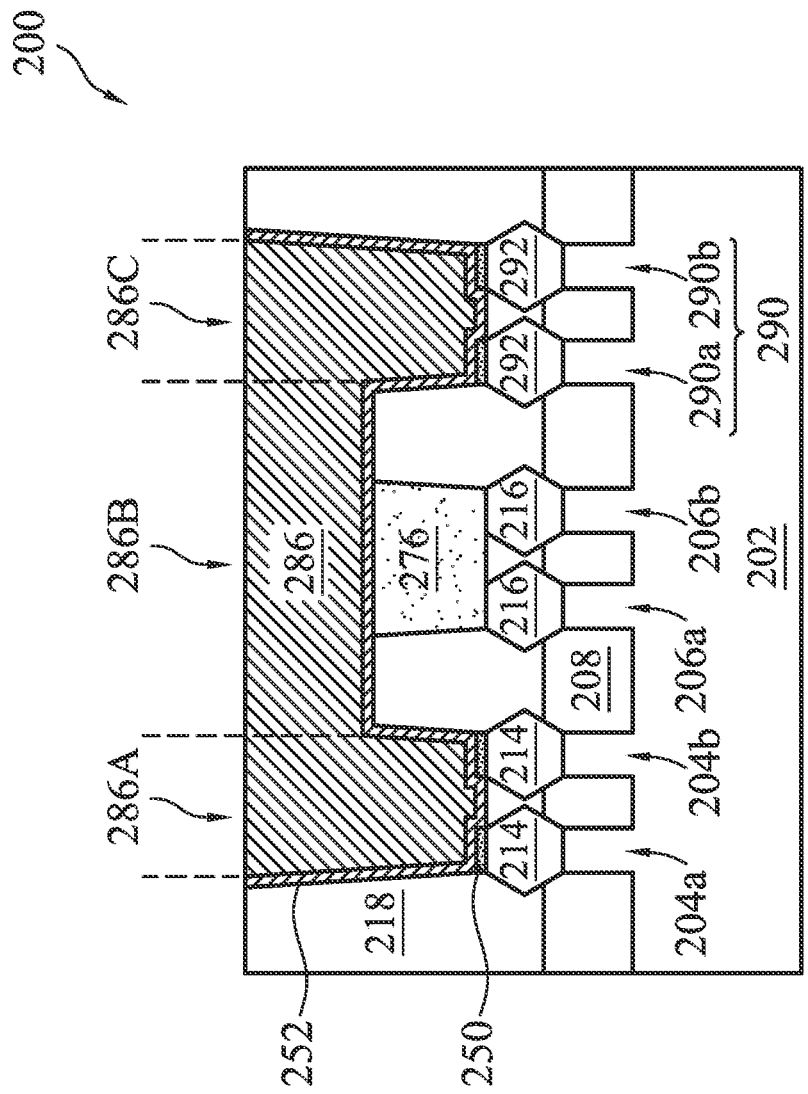

Collectively referring to FIGS. 20-22B, the method 300 at operation 312 forms an S/D contact 286 in the trenches 280 and 282 in a series of processes similar to those described with respect to the operation 110 of the method 100. For example, referring to FIG. 20, the method 300 may form a silicide layer similar to the silicide layer 250 over the exposed S/D features 214, deposit a barrier layer similar to the barrier layer 252 in the trenches 280 and 282, deposit a conductive material similar to the conductive material 254 over the barrier layer 252 (FIG. 21), and perform a planarization process to form the S/D contact 286 (FIG. 22A). The S/D contact 286 may be defined by two portions: a portion 286A disposed over and having a bottom surface defined by the S/D features 214, and a portion 286B extending the portion 286A toward the dummy S/D contact 276 and having a bottom surface defined by a portion of the ILD layer 218 and a portion of the dummy S/D contact 276. In this regard, the portion 286B may be considered an MDX similar to the portion 256C discussed with reference to the S/D contact 256. As depicted in FIG. 22A, the portion 286B's bottom surface is above the bottom surfaces of the portion 286A and separated from the top surface of the S/D features 216 by portions of the ILD layer 218 and the dummy S/D contact 276. FIG. 22B depicts an embodiment similar to that of FIG. 23A, except that the portion 286B spans from the portion 286A to contact the portion 286C_disposed over S/D features 292, which are disposed over the fin 290a and the fin 290b in the third region 290, similar to the embodiment discussed with reference to FIG. 11B.

Referring to FIG. 23A, the method 300 at operation 314 performs additional processing steps to the device 200. For example, similar to the discussion above with respect to FIG. 12A, the method 300 may form vertical interconnect features such as a via similar to the via 260 in an ILD layer similar to the ILD layer 258 disposed over the S/D contact 286 and the ILD layer 218. As such, the portion 286B enlarges a processing window of the S/D contact 286 from W3 to W4, allowing greater flexibility in the patterning of the interconnect features. Other interconnect features, such as a conductive line similar to the conductive line 264, may be subsequently formed in an ILD layer similar to the ILD layer 262 disposed over the ILD layer 258 and the via 260 as depicted in FIG. 23A. Methods of forming the via 260 and the conductive line 264 have been discussed above with respect to FIG. 12A.

Referring to FIG. 23B, the method 300 at operation 314 may, similar to the embodiment depicted in FIG. 12B, etch back a portion of the S/D 286 and the barrier layer 252 to form a trench, and deposit a dielectric material layer similar to the dielectric material layer 266 in the trench to accommodate additional processing steps, such as self-aligned contact formation as discussed above with respect to the FIG. 12B. The via 260 may then be formed by patterning the ILD layer 258 and the dielectric material layer 266 as discussed above.

Although not intended to be limiting, one or more embodiments of the present disclosure provide many benefits to a semiconductor device and the formation thereof. For example, embodiments of the present disclosure provide methods for forming an extended S/D contact (MDX) across two S/D contacts formed over device-level S/D features or across an S/D contact and an isolation feature formed over device-level S/D features without increasing a height of the overall S/D contacts (or the S/D contact and the isolation feature) or increasing barrier layer interface, both of which may reduce device performance (e.g., increase contact resistance). Some embodiments of the present disclosure provide methods of forming dummy contact features over device-level S/D features that include a dielectric material different from a surrounding ILD layer to provide adequate etching selectivity, such that the MDX may be subsequently patterned and metallized together with the S/D contacts. In addition, with the formation of the MDX, a processing window for patterning additional interconnect features (e.g., vias and conductive lines formed over the S/D contacts and the MDX) may be enlarged to accommodate any possible misalignment during such patterning process.

In one aspect, the present disclosure provides a method that includes forming a first dummy S/D contact over a first epitaxial S/D feature and a second dummy S/D contact over a second epitaxial S/D feature in an ILD layer, removing a portion of the first dummy S/D contact, a portion of the second dummy S/D contact, and a portion of the ILD layer disposed between the first and the second dummy S/D contacts to form a first trench; removing a remaining portion of the first dummy S/D contact to form a second trench, and forming a metal S/D contact in the first and the second trenches. In some embodiments, the first and the second dummy S/D contacts include a dielectric material different from a dielectric material of the ILD layer.

In another aspect, the present disclosure provides a method that includes etching an ILD layer to form a first trench exposing a first S/D feature and a second trench exposing a second S/D feature, depositing a dielectric material in the first and the second trenches to form a first dielectric feature and a second dielectric feature, respectively, and replacing the first and the second dielectric features with an S/D contact that contacts the first and the second S/D features. In some embodiments, replacing the first and the second dielectric features includes etching portions of the first and the second dielectric features and a portion of the ILD layer disposed between the first and the second dielectric features to form a third trench having a width spanning from the first dielectric feature to the second dielectric feature, etching remaining portions of the first and the second dielectric features to form a fourth trench that exposes the first and the second S/D features, respectively, and depositing a conductive material in the third and the fourth trenches.

In yet another aspect, the present disclosure provides a semiconductor structure that includes a first epitaxial S/D feature, a second epitaxial S/D feature disposed adjacent the first epitaxial S/D feature, an ILD layer disposed over the first and the second S/D features, a dielectric feature disposed over and contacting the second epitaxial S/D feature, and an S/D contact disposed over and contacting the first epitaxial S/D feature, where a portion of the S/D contact extends through the ILD layer to contact the dielectric feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first epitaxial source/drain (S/D) feature disposed over a first semiconductor fin;
a second epitaxial S/D feature disposed over a second semiconductor fin and adjacent to the first epitaxial S/D feature;
an interlayer dielectric (ILD) layer disposed over the first and the second epitaxial S/D features;
a dielectric feature disposed in the ILD layer and contacting the second epitaxial S/D feature; and
a conductive feature disposed in the ILD layer and electrically coupled to the first epitaxial S/D feature, wherein an extended portion of the conductive feature extends directly above the second S/D epitaxial feature, and the dielectric feature is disposed between the second epitaxial S/D feature and the extended portion of the conductive feature along a vertical direction.

2. The semiconductor structure of claim 1, further comprising a silicide layer disposed between the conductive feature and the first epitaxial S/D feature.

3. The semiconductor structure of claim 1, further comprising a barrier layer, wherein a first portion of the barrier layer is disposed between the conductive feature and the ILD layer, a second portion of the barrier layer is disposed between the conductive feature and the first epitaxial S/D feature, and a third portion of the barrier layer is disposed between the conductive feature and the dielectric feature.

4. The semiconductor structure of claim 1, wherein a portion of a bottom surface of the conductive feature is above the first and the second epitaxial S/D features.

5. The semiconductor structure of claim 1, wherein an outer sidewall of the conductive feature is defined by the dielectric feature.

6. The semiconductor structure of claim 1, wherein sidewalls of the conductive feature are defined by the ILD layer.

7. The semiconductor structure of claim 1, further comprising a dielectric layer disposed over the conductive feature, wherein sidewalls of the dielectric layer are continuous with outer sidewalls of the conductive feature.

8. The semiconductor structure of claim 1, wherein the conductive feature is a first conductive feature, the semiconductor structure further comprising:
a third epitaxial S/D feature, wherein the second epitaxial S/D feature is disposed between the first and the third epitaxial S/D features and the ILD layer is disposed over the first, the second, and the third epitaxial S/D features; and
a second conductive feature disposed over and contacting the third epitaxial S/D feature, wherein a portion of the second conductive feature extends through the ILD layer to contact the dielectric feature and the first conductive feature.

9. A semiconductor structure, comprising:
a first source/drain (S/D) feature and a second S/D feature disposed over a first semiconductor fin and a second semiconductor fin, respectively, wherein the first semiconductor fin and the second semiconductor fin are oriented lengthwise parallel to each other;
an interlayer dielectric (ILD) layer disposed over the first and the second S/D features;
a metal contact disposed in the ILD layer and electrically coupled to the first S/D feature; and
an insulating feature disposed in the ILD layer and on the second S/D feature, wherein a portion of the insulating feature is disposed directly below the metal contact and directly above the second S/D feature.

10. The semiconductor structure of claim 9, wherein a bottom surface of the metal contact interfaces with the ILD layer and the insulating feature.

11. The semiconductor structure of claim 9, wherein a sidewall of the metal contact above the second S/D feature is defined by the insulating feature.

12. The semiconductor structure of claim 9, wherein the metal contact extends laterally through the insulating feature, such that sidewalls of the metal contact are defined by the ILD layer.

13. The semiconductor structure of claim 9, further comprising a silicide layer disposed between the first S/D feature and the metal contact.

14. The semiconductor structure of claim 13, wherein the insulating feature directly contacts a top surface of the second S/D feature.

15. The semiconductor structure of claim 9, wherein the first S/D feature is disposed over a third semiconductor fin, wherein the second S/D feature is disposed over a fourth semiconductor fin, and wherein the third and the fourth semiconductor fins are oriented lengthwise parallel to the first and the second semiconductor fins.

16. A semiconductor structure, comprising:
a first epitaxial source/drain (S/D) feature and a second epitaxial S/D feature disposed over a first semiconductor fin and a second semiconductor fin, respectively;
a first dielectric layer disposed over the first and the second epitaxial S/D features;
an S/D contact disposed in the first dielectric layer to contact the first epitaxial S/D feature;
a second dielectric layer disposed in the first dielectric layer to contact the second epitaxial S/D feature; and
a conductive feature laterally extending from the S/D contact to intersect the second dielectric layer, such that a bottom portion of the conductive feature is partially defined by the second dielectric layer.

17. The semiconductor structure of claim 16, further comprising a silicide layer disposed between the first epitaxial S/D feature and the S/D contact, wherein an interface between the second dielectric layer and the second epitaxial S/D feature is free of a silicide layer.

18. The semiconductor structure of claim 16, wherein the S/D contact is a first S/D contact, further comprising:
a third epitaxial S/D feature disposed over a third semiconductor fin, wherein the second epitaxial S/D feature is disposed between the first and the third epitaxial S/D features; and
a second S/D contact disposed over to contact the third epitaxial S/D feature, wherein the conductive feature laterally extends from the first S/D contact to contact the second S/D contact, such that one sidewall of the conductive feature is defined by the first S/D contact and another sidewall of the conductive feature is defined by the second S/D contact.

19. The semiconductor structure of claim 16, further comprising:
  a third dielectric layer disposed over the S/D contact and the second dielectric layer, such that one sidewall of the third dielectric layer is continuous with a sidewall of the S/D contact and another sidewall of the third dielectric layer is continuous with a sidewall of the conductive feature; and
  a via electrically coupled to the S/D contact, wherein the via extends through the third dielectric layer.

20. The semiconductor structure of claim 19, wherein the via is laterally offset from the S/D contact.

* * * * *